(12) United States Patent
Azimi et al.

(10) Patent No.: US 7,977,989 B2
(45) Date of Patent: Jul. 12, 2011

(54) METHOD AND APPARATUS FOR DETECTING AND ADJUSTING CHARACTERISTICS OF A SIGNAL

(75) Inventors: Kouros Azimi, Center Valley, PA (US); Mohammad S. Mobin, Orefield, PA (US); Gregory W. Sheets, Breinigsville, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/730,671

(22) Filed: Mar. 24, 2010

(65) Prior Publication Data

US 2010/0176856 A1    Jul. 15, 2010

Related U.S. Application Data

(63) Continuation of application No. 12/012,758, filed on Feb. 5, 2008, now Pat. No. 7,696,800.

(60) Provisional application No. 60/899,681, filed on Feb. 6, 2007.

(51) Int. Cl.
*H03K 5/12* (2006.01)
(52) U.S. Cl. ........................................... 327/170
(58) Field of Classification Search .................. 327/170
See application file for complete search history.

(56) References Cited

U.S. PATENT DOCUMENTS

| 5,691,720 | A | * | 11/1997 | Wang et al. ............ 341/143 |
| 5,872,959 | A | | 2/1999 | Nguyen et al. |
| 6,047,346 | A | | 4/2000 | Lau et al. |
| 7,289,374 | B2 | | 10/2007 | Partsch |
| 2003/0122572 | A1 | | 7/2003 | Ajit |
| 2006/0003715 | A1 | | 1/2006 | Partsch |
| 2007/0210832 | A1 | | 9/2007 | Abel et al. |

OTHER PUBLICATIONS

Office Action dated Jul. 14, 2009 from U.S. Appl. No. 12/012,758.

\* cited by examiner

*Primary Examiner* — Lincoln Donovan
*Assistant Examiner* — Daniel Rojas
(74) *Attorney, Agent, or Firm* — Mendelsohn, Drucker & Associates, P.C.; David L. Cargille; Steve Mendelsohn

(57) ABSTRACT

Disclosed is a circuit that adjusts a characteristic of a signal transmitted from a transmitter to a receiver over a communication channel (e.g., a wire, a backplane, etc.). The circuit includes a latch that receives the signal at a predetermined point in the circuit and samples a voltage of the signal many times after a threshold voltage is applied to the latch. The circuit also includes a processor that determines the characteristic of the signal when the sampled voltages indicate a transition point and that adjusts the threshold voltage when the sampled voltages do not indicate a transition point. The processor adjusts the characteristic of the signal by adjusting at least one of a current and a voltage of the transmitter when the characteristic of the signal is outside a predetermined range.

9 Claims, 7 Drawing Sheets

METHOD AND APPARATUS FOR DETECTING AND ADJUSTING CHARACTERISTICS OF A SIGNAL

This application is a continuation of co-pending application Ser. No. 12/012,758, which was filed on Feb. 5, 2008 and claims the benefit of U.S. Provisional Application No. 60/899,681 filed Feb. 6, 2007. The teachings of both application Ser. No. 12/012,758 and U.S. Provisional Application No. 60/899,681 are incorporated herein by reference.

BACKGROUND OF THE INVENTION

The present invention relates generally to integrated circuits (ICs) and more specifically to the detection and adjustment of signal characteristics.

Integrated circuits (ICs) typically include many switching elements, such as transistors. These switching elements are configured to perform a variety of circuit functions.

The operation of a transistor is typically affected by its process, voltage, and temperature ("PVT"). The "process" component of PVT refers to the process of manufacturing a transistor. The process is often classified as "fast", "slow", "nominal", or anywhere in between. A transistor manufactured using a fast process will transmit signals at a faster rate as compared to a transistor manufactured using a slower process. Likewise, a transistor manufactured using a slow process will transmit signals at a slower rate as compared to a transistor manufactured using a faster process. Once a transistor is manufactured using a particular process, the effect of the process is fixed. Thus, the "process" component of PVT cannot be adjusted to change the operating characteristics of a manufactured transistor.

The "temperature" component of PVT is the temperature at which the transistor operates. Similar to the process used to manufacture a transistor, the temperature at which a transistor operates affects how a transistor operates. In particular, the rate at which a transistor transmits a signal is affected by the temperature at which the transistor operates. For example, a transistor operating at a reference temperature requires a first voltage to transmit signals at a first rate. If the temperature of the transistor decreases, less voltage is needed to transmit signals at the first rate. Similarly, if the temperature of the transistor increases, more voltage is needed to transmit signals at the first rate. The "temperature" component of PVT varies during operation of the transistor. While there is some control over the temperature of an IC, such temperature cannot be sufficiently adjusted to result in a change in its operating characteristics.

The only component of PVT that can be varied effectively during operation to adjust a transistor's characteristics is its voltage. The optimum supply voltage of a transistor varies depending on the transistor's process (e.g., fast or slow) and the transistor's operating temperature. A conventional solution to the variation in the optimum supply voltage is to set the supply voltage to a worst-case value. In transistors manufactured with a fast process or operating at a low temperature, this conventional solution often results in too much power being supplied to a transistor, with the excess power being dissipated.

As an example, if a circuit designer determines (e.g., via simulation of an IC having many transistors) that a transistor manufactured with a slow process needs 3.2 V as a supply voltage, the circuit designer may provide a supply voltage of 3.2 V to each transistor on the IC. If another transistor on the IC was manufactured with a fast process, however, that transistor may only need a supply voltage of 3.0 V. When 3.2 V is supplied, excess power is dissipated on the transistor that only needs 3.0 V as a supply voltage. As the number of transistors on the IC that were manufactured with a fast process (or are operating at a low temperature) increases, the amount of dissipated power increases.

For example, a serializer/deserializer (SerDes) is a circuit that converts parallel data to serial data and vice-versa. FIG. 1 shows an example SerDes circuit 100 having a pre-amplifier 105 in communication with one or more loads (e.g., latches 110-125) over a communication channel 130. The communication channel 130 may be a wire, a backplane, or any medium (e.g., air) that can transmit an output of the pre-amplifier 105 to the latches 110-125. Because the pre-amplifier 105 is transmitting its output signal over communication channel 130, the load (i.e., latches 110-125) seen by the pre-amplifier 105 may not be known. As a result, estimates of the load for fast and slow processes are used in simulation. The simulation often produces a worst-case design of the pre-amplifier 105 for a given load to allow for a load manufactured with a slow process. As stated above, this worst-case design typically results in excess power being dissipated.

FIG. 2 shows a block diagram of a transmitter 205 in communication with a receiver 210 over a communication channel 215. A signal's slew rate, or maximum rate of change with respect to time, typically degrades or changes if not optimized before the signal is transmitted over communication channel 215. This degradation is typically due to nonlinearities and imperfections in the communication channel 215. Further, the signal's swing, or the signal's maximum amplitude, may also degrade as the signal is transmitted over the communication channel 215 if the signal's swing is not optimized for the communication channel 215.

The communication channel is often modeled after making one or more assumptions about the transmitted signal's swing and the transmitted signal's slew rate. As a result, a circuit transmitting a signal via the communication channel operates in an optimum manner as long as the assumptions are correct. Usually, however, the assumptions do not account for secondary effects and, as a result, the circuit does not operate in an optimal manner.

Therefore, there remains a need to detect and correct characteristics (such as slew rate and swing) of a transmitted signal.

BRIEF SUMMARY OF THE INVENTION

The present invention provides a technique for adjusting characteristics of a transmitted signal. In one embodiment, a circuit includes a latch that receives the signal at a point in the circuit and samples a voltage of the signal a plurality of times. The circuit also includes a processor that determines the characteristic of the signal when the sampled voltages indicate a transition point. Further, the processor adjusts a threshold voltage applied to the latch when the sampled voltages do not indicate a transition point. The processor adjusts the characteristic of the signal by adjusting at least one of a current and a voltage of the signal's transmitter when the characteristic of the signal is outside a predetermined range.

In one embodiment, the characteristic of the signal is the signal's slew rate. In one embodiment, the processor adjusts the slew rate of the signal by adjusting a tail current of the transmitter. The characteristic of the signal may also be the signal's swing, or maximum amplitude.

The circuit may include one or more additional components. For example, the circuit can also include an interpolator in communication with the latch. The interpolator determines the times at which the latch samples the voltage. The circuit may also include a latch threshold generator in communication with the latch. The latch threshold generator generates the threshold voltage for and applies the threshold voltage to the latch. The circuit may also include one or more counters that count the samples sampled by the latch.

These and other advantages of the invention will be apparent to those of ordinary skill in the art by reference to the following detailed description and the accompanying drawings.

DETAILED DESCRIPTION

A serializer/deserializer (SerDes) is a circuit commonly used in high speed communications that converts parallel data to serial data and vice versa. A SerDes typically includes one or more clock and data recovery (CDR) systems.

CDR systems operate in many communication circuits. Digital communication receivers sample an analog waveform and then detect the data that the waveform represents. The phase of the analog waveform is typically unknown and there may be a frequency offset between the frequency at which original data was transmitted and the nominal receiver sampling clock frequency. The CDR system is used to properly sample an analog waveform using a reference clock to correctly recover the data.

Figure 3:
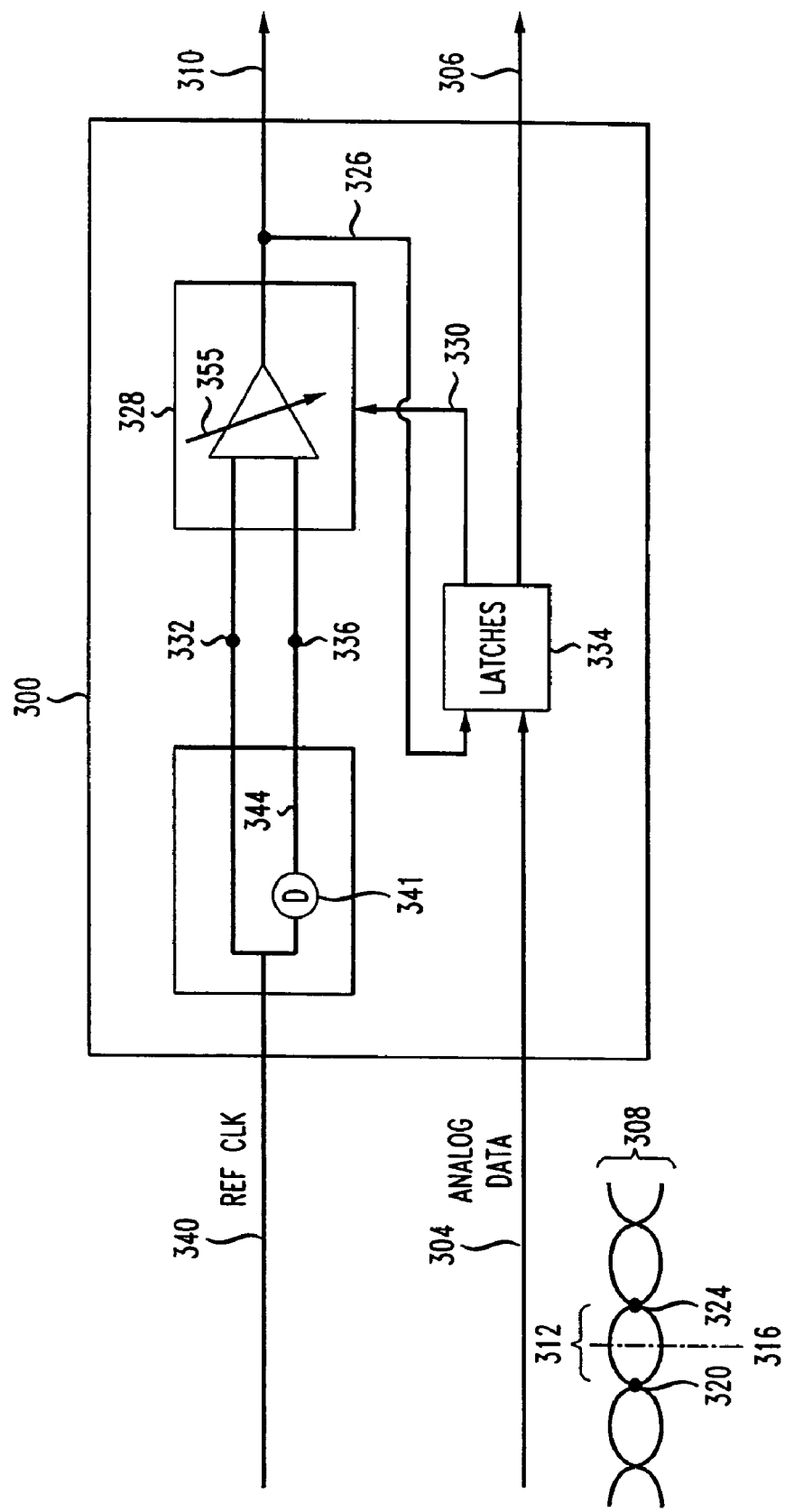
FIG. 3 is a block diagram of an example clock and data recovery (CDR) circuit.

FIG. 3 shows a block diagram of an example CDR circuit 300. The CDR circuit 300 receives as input a reference clock 340 and an analog data stream 304 that represents digital bits (i.e., 1s and 0s), and provides as output a recovered clock 310 and recovered data 306. The data stream 304 is often a differential waveform as represented by waveform 308. The differential waveform 308 has multiple so-called "eyes" 312 which represent the maximum and minimum amplitude of the data stream 304 during a time interval. The waveform 308 has transition points, such as transition points 320, 324, that indicate the transition from one eye to the next. Each eye also has a respective midpoint (e.g., midpoint 316 of eye 312).

The CDR circuit 300 includes a series of latches 334 that are clocked from a clock signal 326 to sample the data stream 304 at the midpoint 316 of the eye 312. The midpoint 316 of the eye 312 is typically sampled because the CDR circuit often has the best chance of correctly identifying whether the waveform is representing a digital 0 or a digital 1 at that instant in time. The CDR circuit 300 determines each transition point (e.g., transition point 320 and 324) and the midpoint 316 of the eye 312.

As described above, due to imperfections and nonlinearities in the communication channel, or offset between the transmit and receive frequencies, the data signal may shift in time during the transmission relative to the clock signal. This shifting in time may result in the differential waveform 308 moving (in one or both directions over time with respect to the reference clock 340) as it is being received by the CDR circuit 300.

The CDR circuit 300 determines this time shifting in order to ensure that the CDR circuit 300 samples each eye 312 of the waveform 308 at its midpoint 316. The CDR circuit 300 determines the transition points 320 and 324 and midpoint 316 of each eye 312 and then changes the phase of an output signal 326 of an interpolator 328 of the CDR circuit 300, via a control signal 330. The CDR circuit 300 samples the input data stream 304 at points determined by the phase of the output signal 326 of the interpolator 328.

To change the phase of signal 326, reference clock signal 340 is delayed by delay element 341, creating a delayed clock signal 344. These clock signals 340, 344 are transmitted to each input 332, 336 of the interpolator 328. These two clock signals 340, 344 provide the minimum phase and the maximum phase for the interpolator 328.

The interpolator 328 has a control 355 that enables the programming of the interpolator 328 to output a signal having one of a predetermined number of phases, such as one of 16 different phase possibilities. The control 355 is typically a digital control.

Utilizing control 355 of the interpolator 328, the delay or phase associated with waveform 326 that is the output of the interpolator 328 can be varied from the starting phase associated with clock signal 340 to the ending phase (i.e., delayed phase) of the delayed clock signal 344. Thus, the possible start phase and end phase of output signal 326 is controlled by the control 355 of the interpolator 328.

Some of the components of a CDR can also be used to detect the slew rate of a data signal. The slew rate of a signal can be defined as $$\frac{\Delta \text{voltage}}{\Delta \text{time}}.$$

Figure 4:
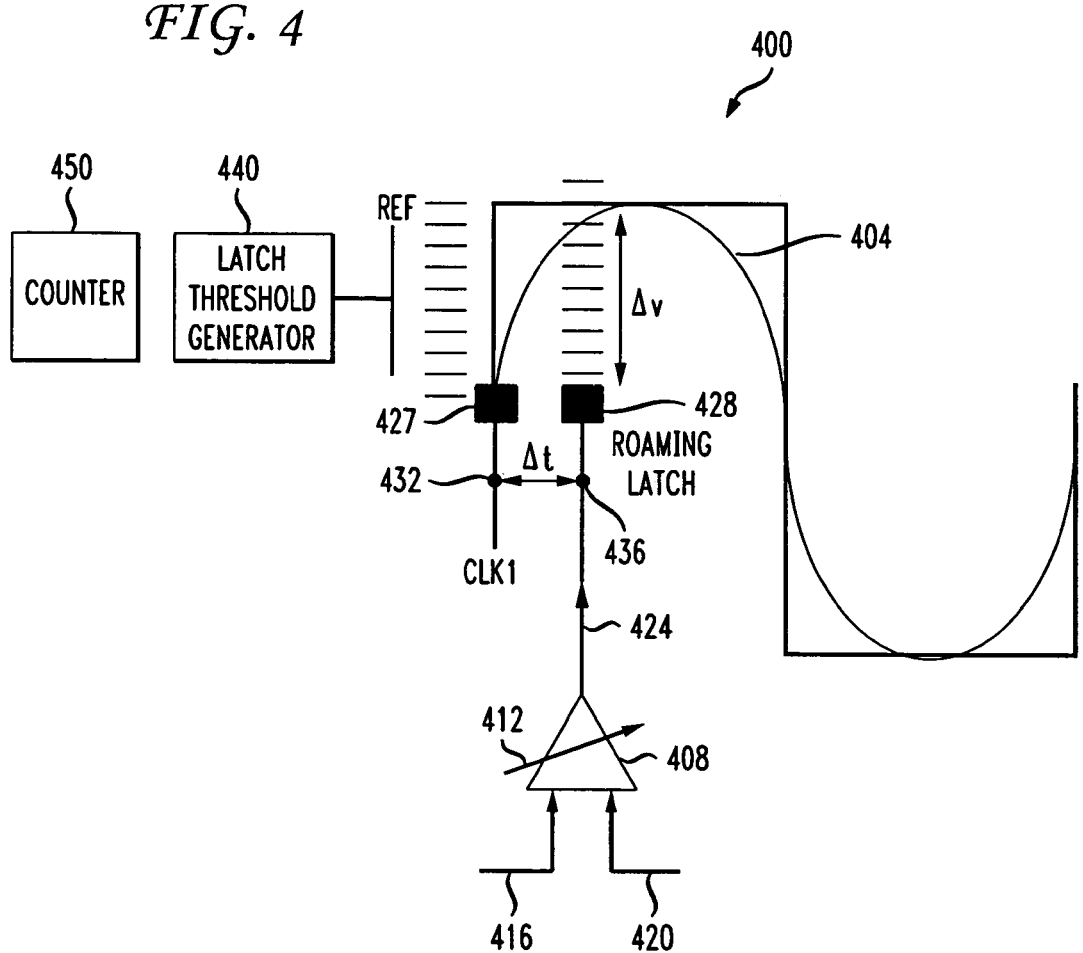
FIG. 4 is a block diagram of a circuit used to detect the slew rate of a signal transmitted by a transmitter.
Figure 5:
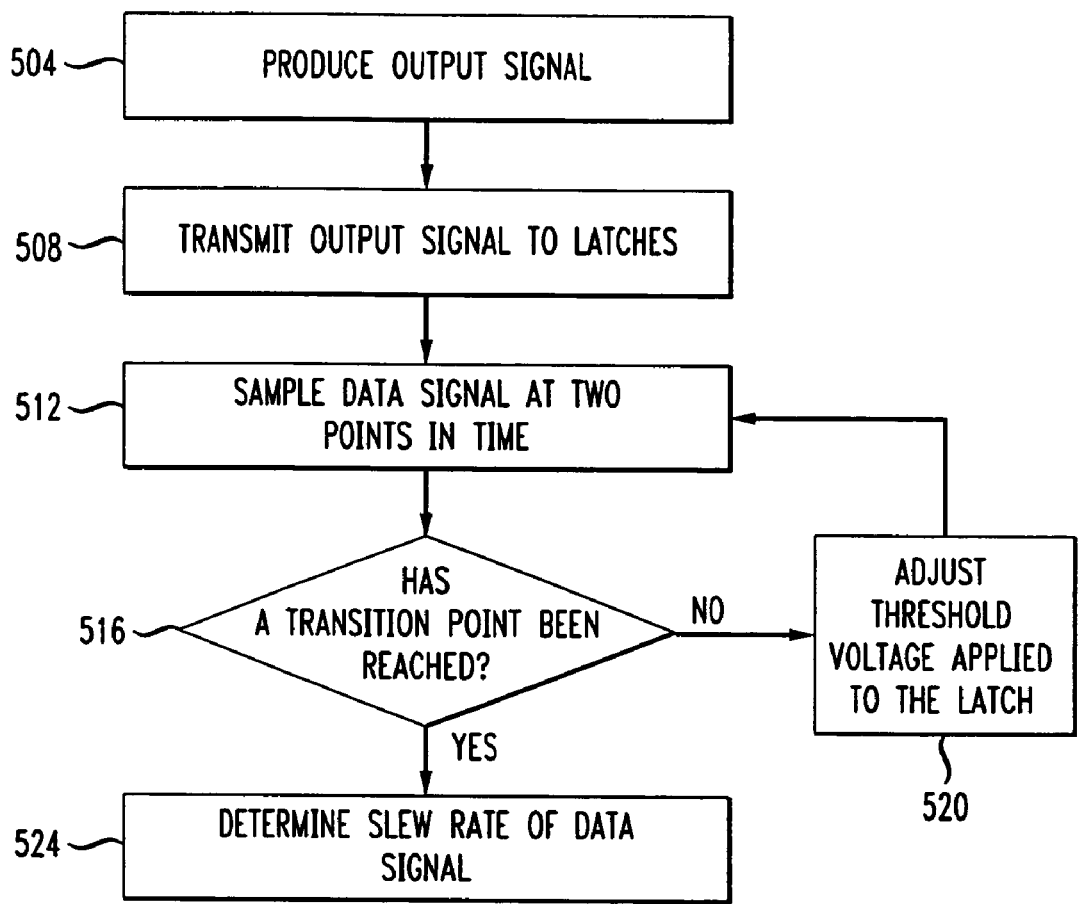
FIG. 5 shows a flowchart illustrating the steps performed to determine the slew rate of a signal.

FIG. 4 shows a block diagram of a circuit 400 that can detect the slew rate of an analog data signal 404. FIG. 5 shows a flowchart illustrating the steps performed by the circuit 400 to determine the slew rate of a signal.

An interpolator 408 including a control 412 produces an output signal 424 in step 504. In step 508, output signal 424 of the interpolator 408 is then transmitted to a latch 428 which is part of the latches block 334 of FIG. 3.

Another latch 427, which is also part of the latches block 334 of FIG. 3, samples the voltage of the data signal 404 at a first time $t_1$ 432, and the latch 428 samples the voltage of the data signal 404 at a second time $t_2$ 436 in step 512. The sampling time $t_2$ is based on the output signal 424 of the interpolator 408. The difference between the two sampling times is then determined by subtracting $t_1$ from $t_2$. The latch 428 then detects in step 516 whether a transition point has been reached. A transition point has been reached when the latch 428's sampling pattern changes from either a zero to a one or from a one to a zero. In one embodiment, a processor 460 in communication with the latch 428 (as indicated in FIG.

4 by dotted line 434) determines if a transition point has been reached. If a transition point has not been reached in step 516, the processor 460 communicates with a latch threshold generator 440 (as indicated in FIG. 4 by dotted line 436) to change a threshold voltage (shown as REF in FIG. 4) applied to the latch 428 (and/or latch 427) in step 520. After an adjustment to the threshold voltage has been made, the process returns to step 512 and the data signal is sampled again at two time points. If a transition point has been reached in step 516, the slew rate of the data signal is determined in step 524 using the two sampled voltages and the two time points.

In one embodiment, the circuit 400 also includes a counter 450 in communication with latch 428 (as indicated in FIG. 4 by dotted line 438). The counter 450 counts the number of samples taken by the latch 428 and may include logic to track how many 1's are sampled by the latch and how many 0's are sampled by the latch in a given number of samples. In one embodiment, the counter 450 determines whether a transition point has been reached in step 516 based on a plurality of samples. For example, if the counter 450 determines, in ten samples, that five samples are zero and five samples are one, then the counter can determine that a transition point has been reached in step 516. If, however, the counter 450 determines that all ten samples are a zero, then the counter 450 can determine that a transition point has not been reached in step 516.

Figure 6:
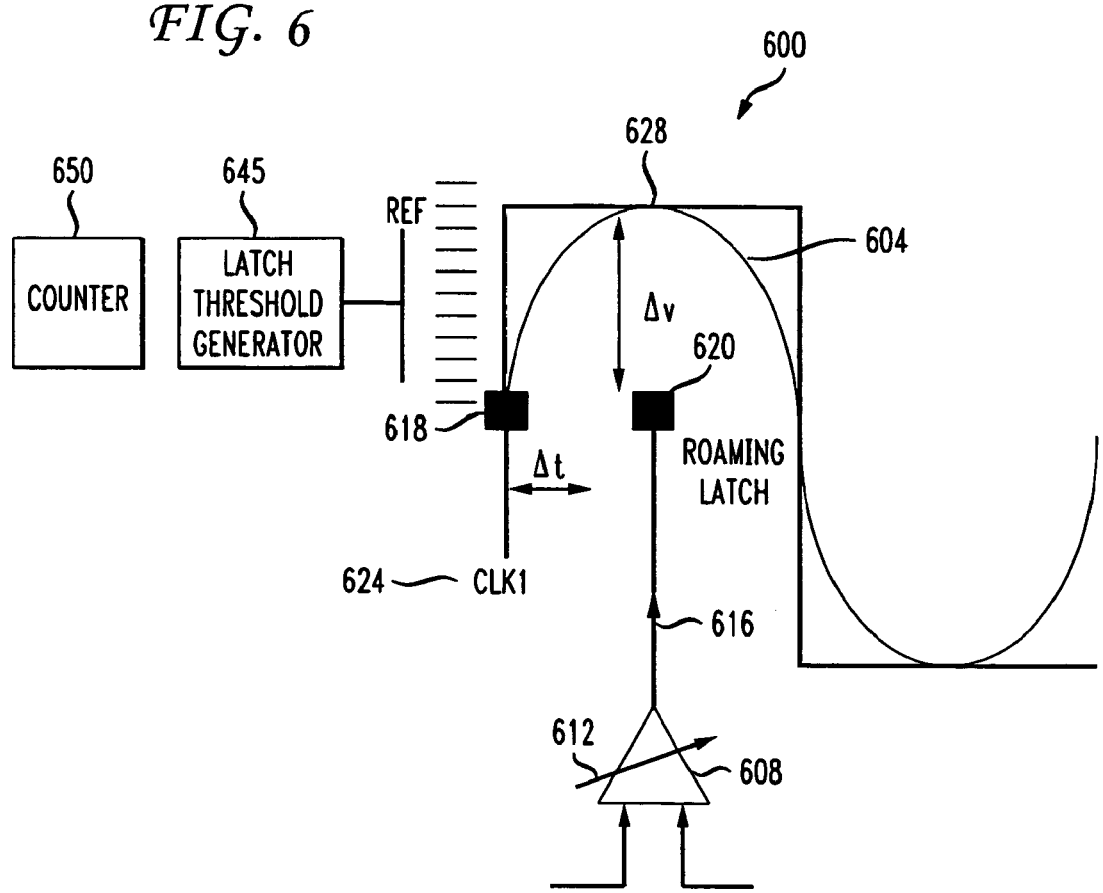
FIG. 6 is a block diagram of a circuit to detect the swing of a signal.

FIG. 6 is a block diagram of a circuit 600 to detect the swing (i.e., maximum amplitude) of a data signal 604. The circuit 600 includes an interpolator 608 having a control 612. The interpolator 608 transmits an output signal 616 to latch 620. The latches 618, 620 sample the data signal 604 at two different time points. To determine the swing of the data signal 604, the latch 620 is set by the interpolator 608 to the middle of the "eye" of the data signal 604.

The circuit 600 of FIG. 6 can perform steps 504-516 shown in FIG. 5 to determine the swing of the data signal 604. In step 504, the interpolator 608 interpolates to a given time between the input clock signals to produce an output clock signal. The given time between the input clock signals is set to the middle of the eye of the data signal 604. The output signal 616 is transmitted to the latch 620 in step 508. The latches 618, 620 sample the data signal at two points in time in step 512. The two points in time are a starting point of the data signal 604 (shown as CLK1 624) and the midpoint 628 of the eye of the data signal 604. As described above, the circuit 600 may include a latch threshold generator 645 and/or a counter 650 (or processor).

Figure 1:
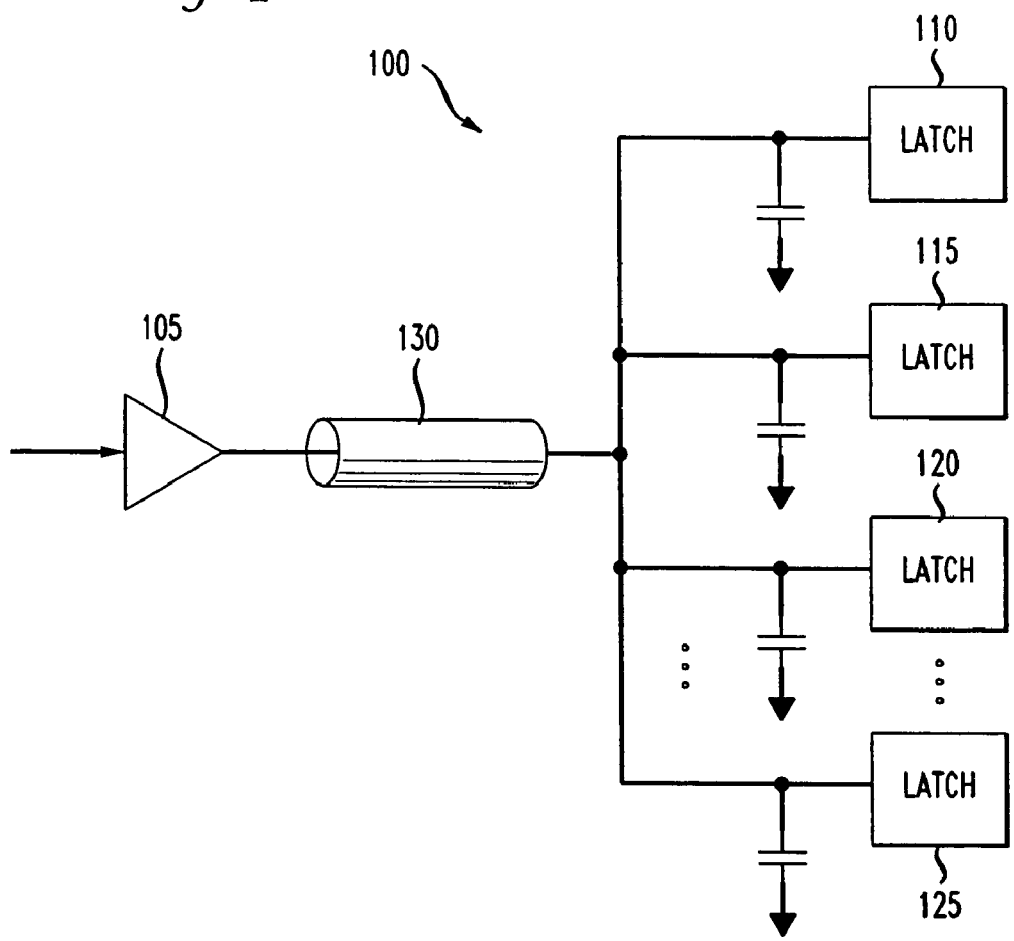
FIG. 1 is an example serializer/deserializer (SerDes) circuit having a pre-amplifier in communication with a load over a communication channel.
Figure 2:
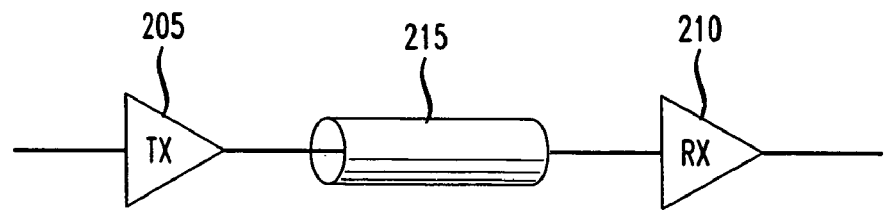
FIG. 2 is a block diagram of an example circuit having a transmitter in communication with a receiver over a communication channel.
Figure 7:
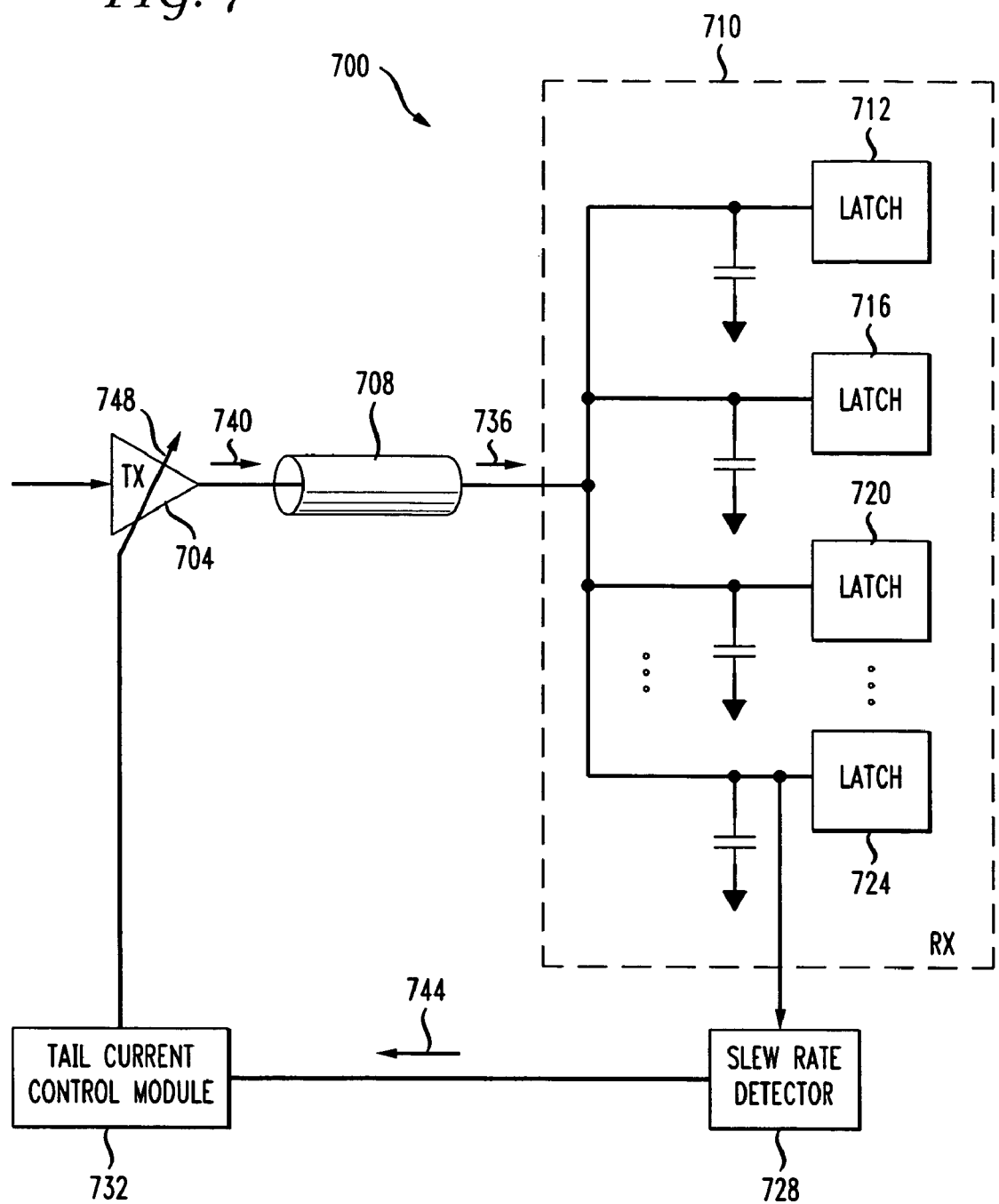
FIG. 7 is a block diagram of a SerDes circuit incorporating the circuit of FIG. 4.

In accordance with an embodiment of the invention, after the swing and/or slew rate of a signal is detected, the swing and/or slew rate of the signal may be corrected. FIG. 7 is a block diagram of a circuit 700 similar to the circuit 100 of FIG. 1 incorporating the slew rate detector of FIG. 4.

Specifically, the circuit 700 includes a pre-amplifier 704 in communication with a communication channel 708 and a receiver 710 (shown with dashed lines) including a plurality of latches 712-724. The circuit 700 also includes a slew rate detector 728 in communication with a tail current control module 732 (and, in one embodiment, an external processor). The slew rate detector 728 detects the slew rate of a signal 736 that is transmitted as input to latches 712-724 of receiver 710. This signal 736 is the output of the communication channel 708.

In one embodiment, the signal 736 has been degraded due to the communication over the communication channel 708. Circuit 700 adjusts the slew rate of output signal 740 of the pre-amplifier 704 in order to maintain an adequate (and accurate) input signal 736 to the latches (e.g., latch 724).

The slew rate detector 728 detects the slew rate of the input signal 736 as described above with respect to FIG. 4 and FIG. 5. The slew rate detector 728 transmits the slew rate of the input signal 736 as slew rate signal 744 to the tail current control module 732. The tail current control module 732 adjusts the tail current of the pre-amplifier 704, as shown with arrow 748, via methods known to those of ordinary skill in the art, if the slew rate denoted in the slew rate signal 744 is not within a predetermined range. The tail current control module 732 may be a processor or a state machine.

As shown, the tail current control module 732 and the slew rate detector 728 form a feedback loop that adjusts the slew rate of the output signal 740 of the pre-amplifier 704 until the slew rate of the signal 736 transmitted to the receiver 710 is within a predetermined range. In one embodiment, the slew rate detector 728 periodically monitors the slew rate of the input signal 736. Alternatively, the slew rate detector 728 continually (or a set number of times) monitors the slew rate of the input signal 736.

Figure 8:
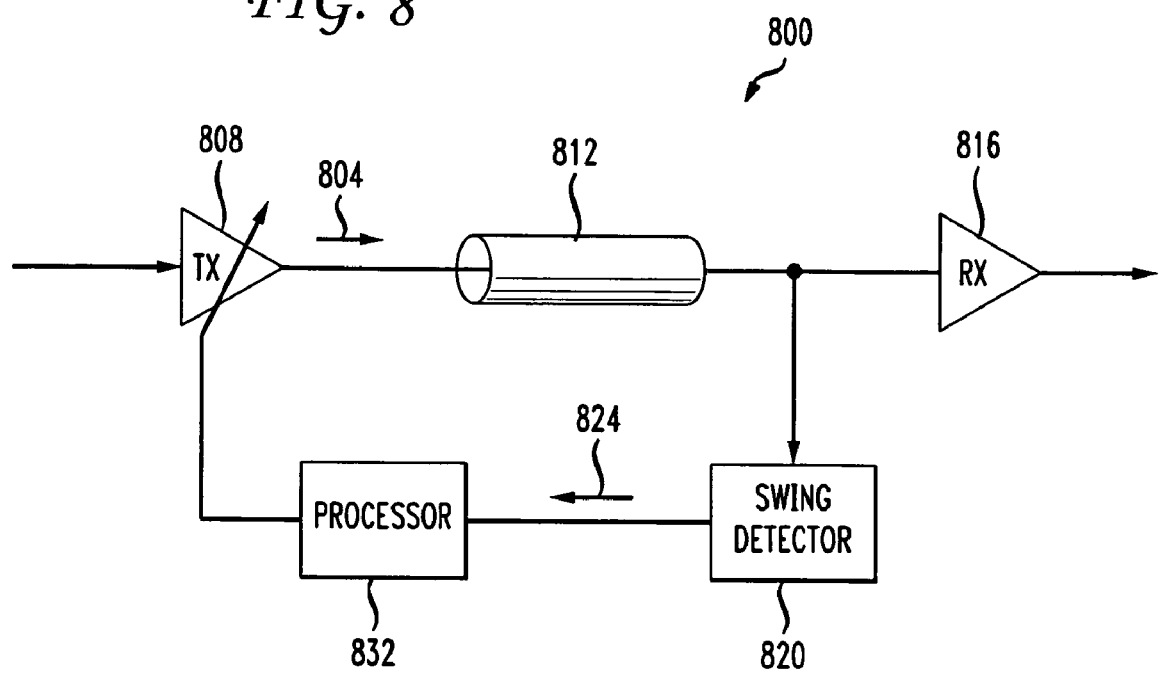
FIG. 8 is a circuit that can adjust the swing of a transmitted signal transmitted by a transmitter over a communication channel to a receiver.

FIG. 8 is a circuit 800 that corrects the swing of a transmitted signal 804 transmitted by a transmitter 808 over a communication channel 812 to a receiver 816. In particular, as the voltage and/or temperature of the transmitter 808 changes (e.g., a transistor of the transmitter 808 begins to heat up), the swing of the transmitted signal 804 may vary. This variation in the transmitted signal's swing may result in cross talk for neighboring channels. Further, the variation in the swing of the transmitted signal 804 may degrade the performance of the circuit 800 and may result in excess power being dissipated.

In one embodiment, the transmitter's operating voltage is adjusted to correct the swing of the transmitted signal 804. To perform this adjustment, a swing detector 820 receives the transmitted signal 804 (via connection 814, or, alternatively, connection 810) and detects the swing of this signal as described above (e.g., in FIG. 6). The swing detector 820 transmits a swing signal 824 indicating the determined swing to a processor (or state machine) 832. In one embodiment, the processor 832 adjusts the transmitter's supply voltage until the swing of the transmitted signal 804 is within a target level. The swing detector 820 and the processor 832 form a feedback loop with the transmitter 808. The swing detector 820 may determine the swing of the transmitted signal 804 continuously, periodically, a set number of times, etc. In another embodiment, the processor 832 adjusts the transmitter's current drive in order to change the swing of the transmitted signal 804. The processor's functions are defined and controlled via, for example, software (embedded or otherwise), firmware, and/or hardware.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A circuit for adjusting a slew rate of a signal transmitted by a transmitter to a receiver over a communication channel, said circuit comprising:
   a slew-rate detector configured to (i) sample a voltage of the signal at a plurality of times to produce a plurality of sampled voltages and (ii) detect the slew rate of the signal based on the plurality of sampled voltages, wherein the slew-rate detector comprises:
      a first latch configured to sample the voltage of the signal at the plurality of times; and
      an interpolator in communication with said first latch and configured to determine said plurality of times at which said latch samples said voltage; and
   a control module configured to adjust the slew rate of the signal by adjusting a current of said transmitter when the slew rate of the signal is outside a predetermined range.

2. The circuit of claim 1, wherein said current is a tail current of said transmitter.

3. The circuit of claim 1, wherein said first latch obtains a plurality of samples by sampling said voltage said plurality of times.

4. The circuit of claim 3, further comprising a counter in communication with said latch and configured to count said plurality of samples sampled by said first latch.

5. The circuit of claim 1, wherein the slew-rate detector further comprises a second latch configured to sample a voltage of the signal at a first plurality of times before said plurality of times.

6. A method for adjusting a slew rate of a signal transmitted by a transmitter to a receiver over a communication channel, said method comprising:
   a detector sampling a voltage of the signal at a plurality of times to produce a plurality of sampled voltages;
   the detector detecting the slew rate of the signal based on the plurality of sampled voltages;
   a control module adjusting the slew rate of the signal by adjusting a current of said transmitter, when the slew rate of the signal is outside a predetermined range; and
   counting said plurality of sampled voltages.

7. The method of claim 6, wherein said current is a tail current of said transmitter.

8. A circuit for adjusting a slew rate of a signal transmitted by a transmitter to a receiver over a communication channel, said circuit comprising:
   means for sampling a voltage of the signal at a plurality of times to produce a plurality of sampled voltages;
   means for detecting the slew rate of the signal, based on the plurality of sampled voltages;
   means for adjusting a current of said transmitter to adjust the slew rate of the signal, when said slew rate is outside a predetermined range; and
   means for counting said plurality of sampled voltages.

9. The circuit of claim 8, wherein said current is a tail current of said transmitter.

* * * * *